(12) United States Patent
Kondo et al.

(10) Patent No.: US 9,537,075 B2
(45) Date of Patent: Jan. 3, 2017

(54) GRAPHITE STRUCTURE, ELECTRONIC COMPONENT AND METHOD OF MANUFACTURING ELECTRONIC COMPONENT

(75) Inventors: Daiyu Kondo, Kawasaki (JP); Shintaro Sato, Kawasaki (JP); Taisuke Iwai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/286,339

(22) Filed: Nov. 1, 2011

(65) Prior Publication Data

US 2012/0042922 A1    Feb. 23, 2012

Related U.S. Application Data

(63) Continuation of application No. PCT/JP2009/060934, filed on Jun. 16, 2009.

(51) Int. Cl.
| | | |
|---|---|---|
| *H01L 35/28* | (2006.01) | |
| *H01L 35/22* | (2006.01) | |
| *H01L 29/16* | (2006.01) | |
| *C01B 31/04* | (2006.01) | |
| *H01L 35/32* | (2006.01) | |

(52) U.S. Cl.
CPC ............. *H01L 35/22* (2013.01); *C01B 31/04* (2013.01); *H01L 29/1606* (2013.01); *H01L 35/32* (2013.01); *Y10T 428/261* (2015.01)

(58) Field of Classification Search
CPC .................................................... H01M 4/133
USPC ........................................................ 136/230
See application file for complete search history.

(56) References Cited

U.S. PATENT DOCUMENTS

| | | | |
|---|---|---|---|
| 3,305,405 A * | 2/1967 | Jamieson ....................... 136/232 |
| 3,485,679 A * | 12/1969 | Dingwall ....................... 136/205 |
| 5,128,209 A | 7/1992 | Sakai et al. |
| 5,316,080 A * | 5/1994 | Banks et al. .................. 165/185 |
| 2003/0117770 A1* | 6/2003 | Montgomery et al. ........ 361/687 |
| 2005/0206293 A1 | 9/2005 | Taomoto et al. |
| 2007/0259186 A1* | 11/2007 | Ozaki et al. .................. 428/408 |
| 2008/0131352 A1* | 6/2008 | Kondo ......................... 423/447.3 |
| 2008/0230110 A1* | 9/2008 | Freedman ..................... 136/246 |

FOREIGN PATENT DOCUMENTS

| | | |
|---|---|---|
| JP | 4-062042 A | 2/1992 |
| JP | 4-62042 A | 2/1992 |
| JP | 2000-178070 A | 6/2000 |
| JP | 2002-284514 A | 10/2002 |

OTHER PUBLICATIONS

Uher, Physical Review B, 1982, vol. 25, pp. 4167-4172.*
Ren, et al., Science, 1998, vol. 282, p. 1105.*
"Nano-Lab Arrays"—Specification Sheet—Evidentiary Reference.*

(Continued)

*Primary Examiner* — Marla D McConnell
*Assistant Examiner* — Sadie White
(74) *Attorney, Agent, or Firm* — Westerman, Hattori, Daniels & Adrian, LLP

(57) ABSTRACT

The graphite structure includes a plurality of domains of graphite where a layer body of graphene sheets is curved in domelike, wherein the plurality of domains are arranged in plane, and the domains adjacent each other are in contact with each other.

14 Claims, 14 Drawing Sheets

(56) References Cited

OTHER PUBLICATIONS

Sutter, et al., Applied Physics Letters, 90, 093118 (2007).*
Marton, D. et al., "On the defect structure due to low energy ion bombardment of graphite", Surface Science, 1995, pp. 489-493, vol. 326 cited in ISR.
International Search Report of PCT/JP2009/060934, mailing date Sep. 8, 2009.
Marton, D. et al., "On the defect structure due to low energy ion bombardment of graphite," Surf. Sci., 1995, vol. 326, p. L489-L493, cited in Japanese Office Action dated Dec. 17, 2013.
Japanese Office Action dated Dec. 17, 2013, issued in corresponding Japanese Patebt Application No. 2011-519336 with English Translation. (7 pages).
Extended European Search Report dated Oct. 10, 2013, issued in corresponding European Application No. 09846150.2.
European Office Action dated Jul. 31, 2014, issued in corresponding EP application No. 09846150.2 (7 pages).
Office Action dated Jul. 25, 2016, issued in counterpart European Patent Application No. 09 846 150.2. (6 pages).

\* cited by examiner

GRAPHITE STRUCTURE, ELECTRONIC COMPONENT AND METHOD OF MANUFACTURING ELECTRONIC COMPONENT

CROSS REFERENCE TO RELATED APPLICATIONS

This application is a Continuation of International Application No. PCT/JP2009/060934, with an international filing date of Jun. 16, 2009, which designating the United States of America, the entire contents of which are incorporated herein by reference.

FIELD

The embodiments discussed herein are related to a graphite structure, an electronic component using the graphite structure and a method of manufacturing the electronic component.

BACKGROUND

The technology of converting heat to electricity, i.e., the thermoelectric conversion technology, which can effectively utilize as electric power the waste heat generated from industrial materials and civilian materials, is noted in many fields as an important technology intended for the prevention of earth warming-up.

The thermoelectric conversion device generally includes a p-type semiconductor thermoelectric conversion material and an n-type semiconductor thermoelectric conversion material sandwiched by electrodes. In order for the thermoelectric conversion materials to be highly effective, it is preferable that they have a large dimensionless performance index which is called ZT. To raise the performance index ZT, it is preferable that they have a high Seebeck coefficient, have a high electric conductivity and have a low heat conductivity.

The following is an example of related: Japanese Laid-open Patent Publication No. 2000-178070.

Satisfying a high electric conductivity and a low heat conductivity at once requires properties which are conflict depending on cases. For example, the material is nanostructured, whereby phonons are scattered at the interface of the nanostructures, and the heat conductivity can be lowered. On the other hand, the material is nanostructured, whereby, in many cases, the electric conductivity is degraded.

Accordingly, it is generally difficult to satisfy a high electric conductivity and a low heat conductivity at once, and so far, thermoelectric conversion materials having sufficiently high performance index ZT have not been found.

SUMMARY

According to one aspect of an embodiment, there is provided a graphite structure including a plurality of domains of graphite where a layer body of graphene sheets is curved in domelike, wherein the plurality of domains are arranged in plane, and the domains adjacent each other are in contact with each other.

According to another aspect of an embodiment, there is provided an electronic component including a graphite structure including a plurality of domains of graphite where a layer body of graphene sheets is curved in domelike, wherein the plurality of domains are arranged in plane, and the domains adjacent each other are in contact with each other.

According to further another aspect of an embodiment, there is provided a method of manufacturing an electronic component including forming a catalytic metal film above a substrate, roughening a surface of the catalytic metal film, and forming a graphite structure including domains of a plurality of domed graphite formed in conformity with concavities and convexities in the surface of the catalytic metal film by growing graphite using the catalytic metal film having the surface roughened as a catalyst.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

[A First Embodiment]

A graphite structure and a method of manufacturing the same according to a first embodiment will be described with reference to FIGS. 1 to 8C.

Figure 1:
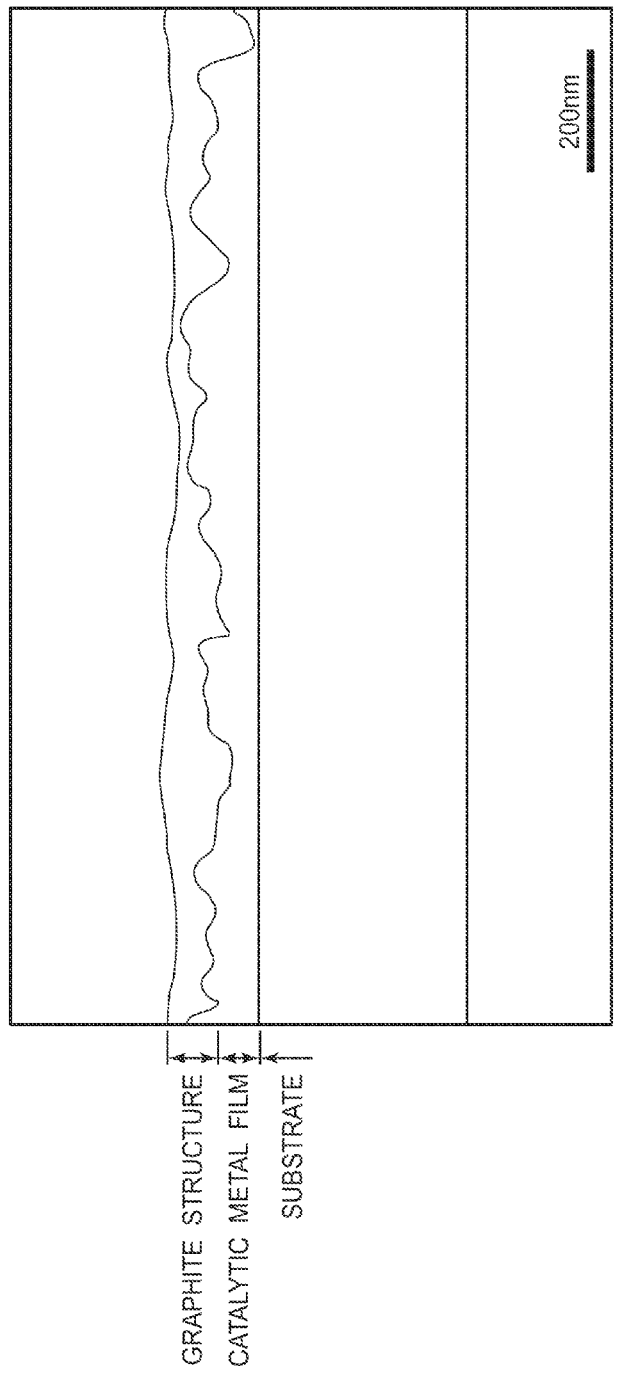
FIG. 1 is a sectional view illustrating a structure of a graphite structure according to a first embodiment.
Figure 2:
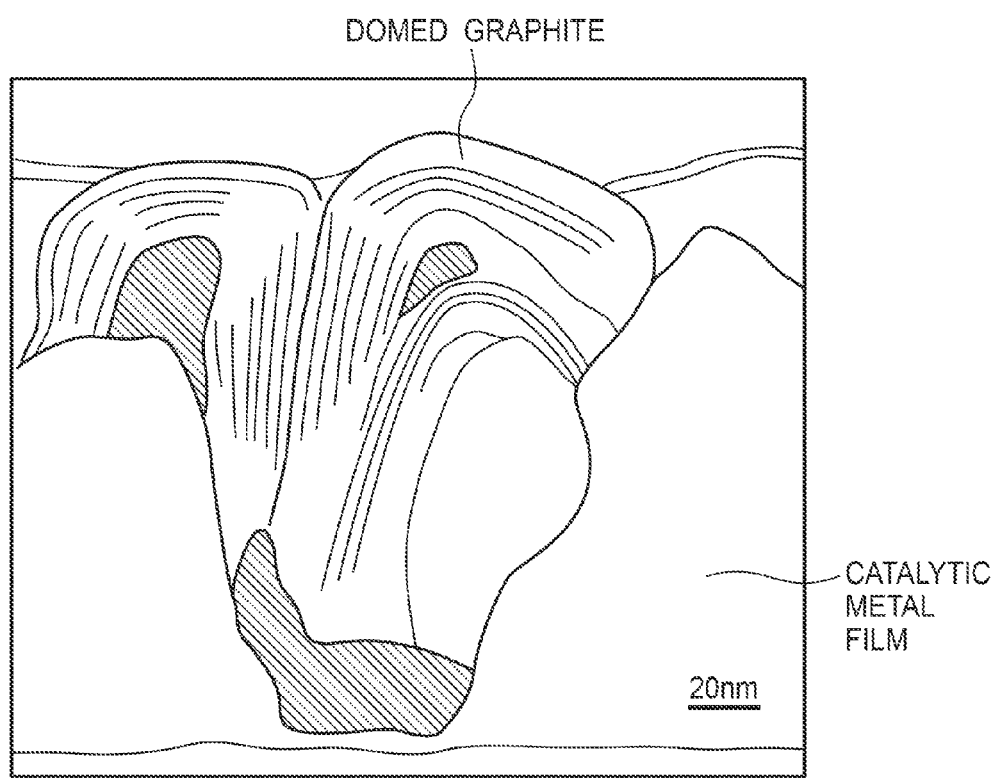
FIG. 2 is an enlarged sectional view illustrating the structure of the graphite structure according to the first embodiment.
Figure 3:
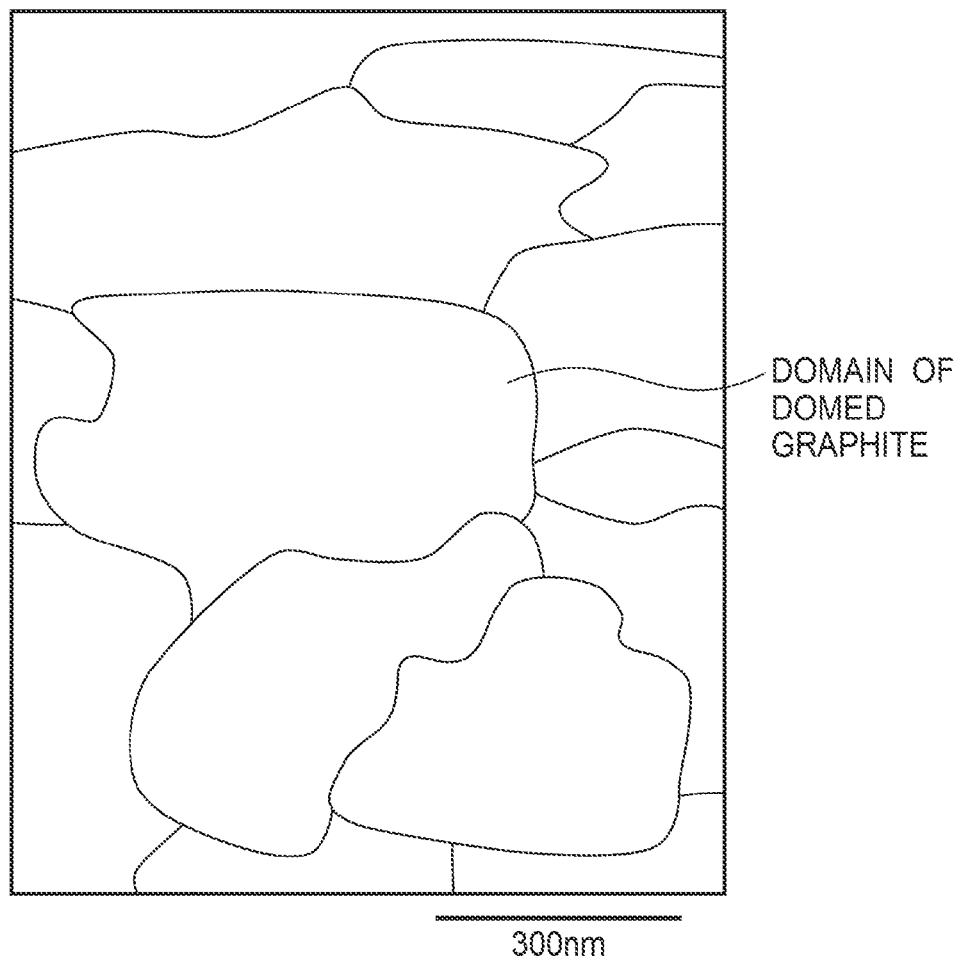
FIG. 3 is a plan view illustrating the structure of the graphite structure according to the first embodiment.
Figure 4:
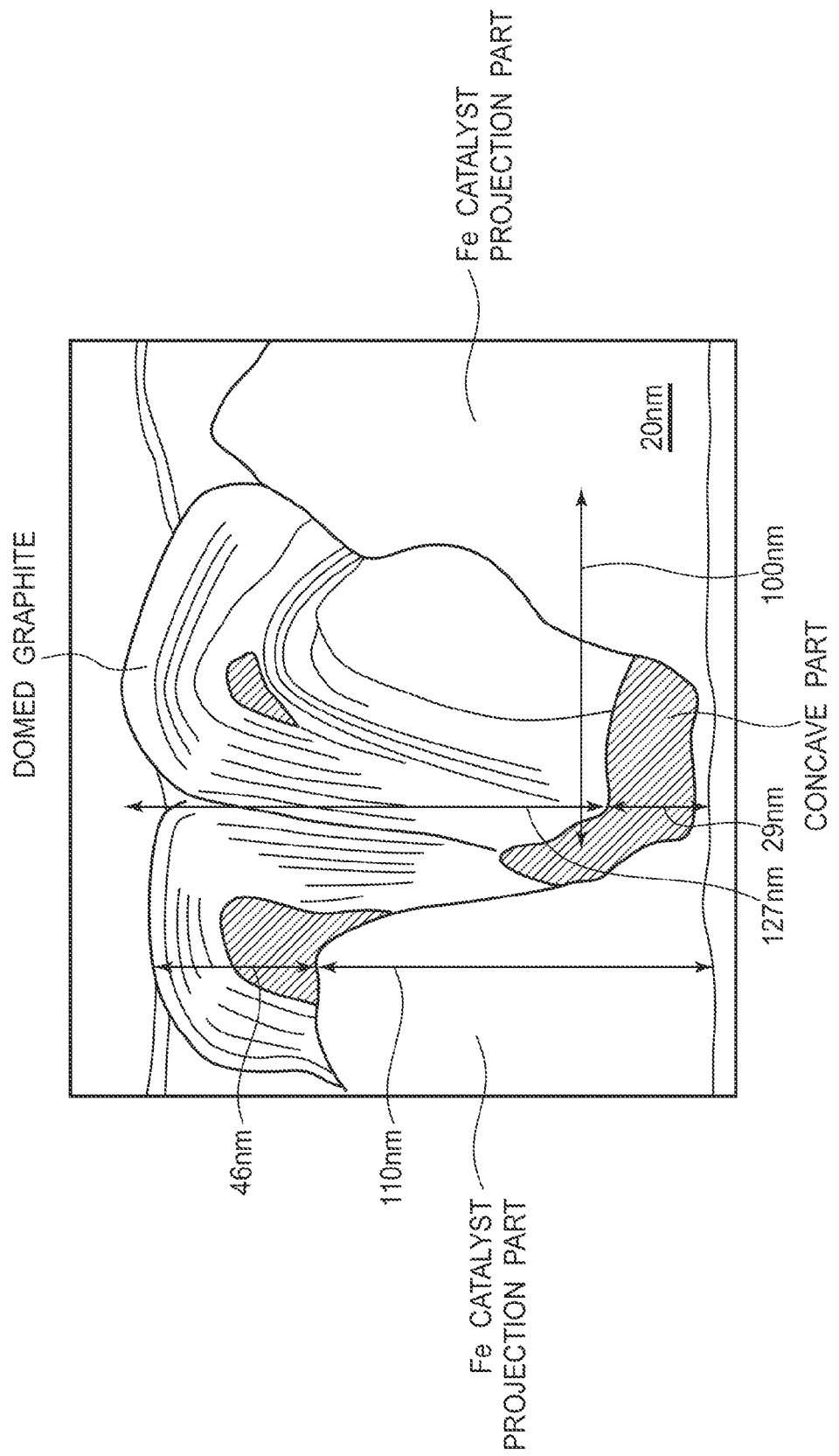
FIGS. 4 and 5 are views illustrating a relationship between a configuration of a catalytic metal film and a configuration of the graphite structure to be grown.
Figure 5:
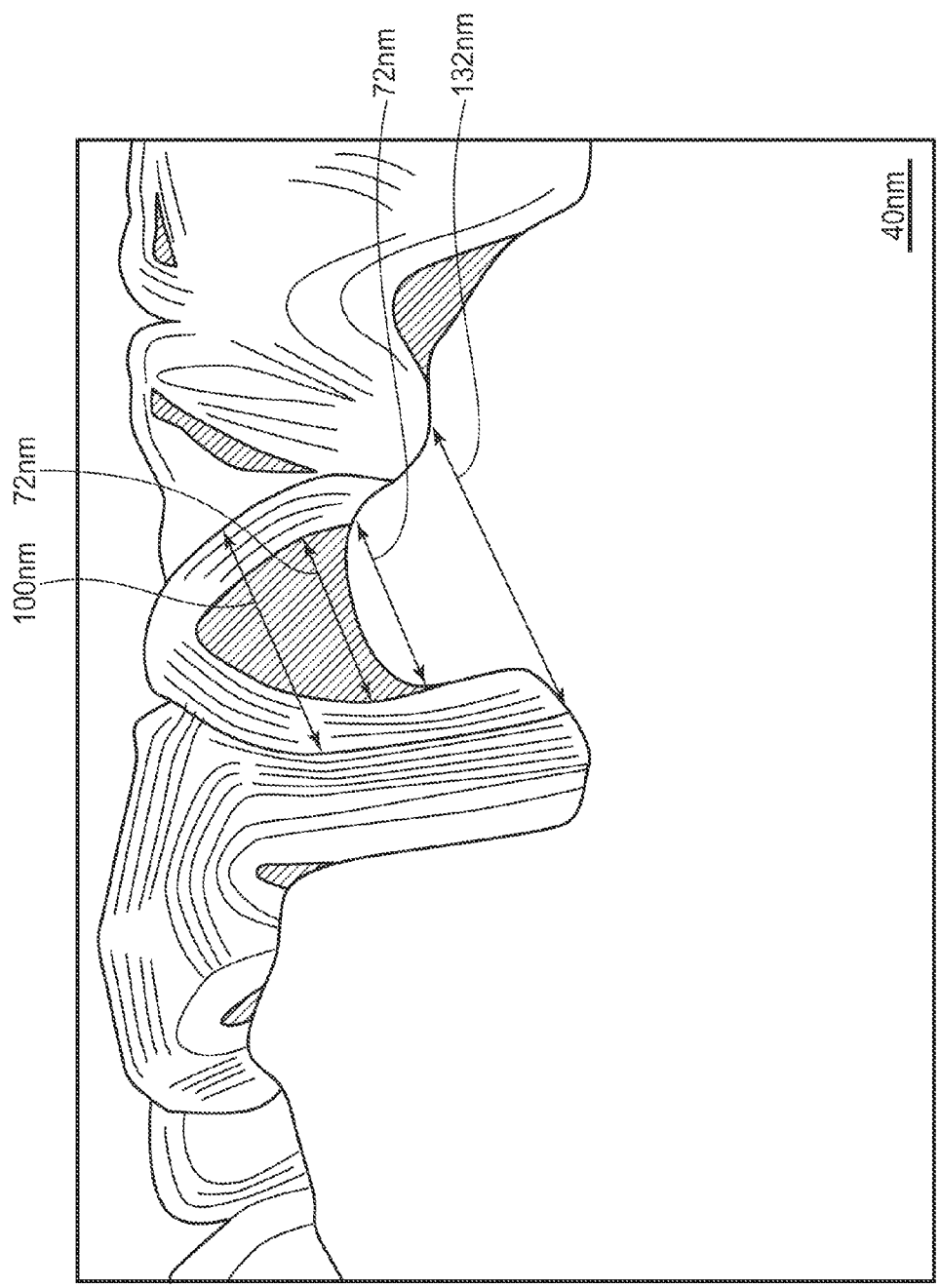
Figure 6:
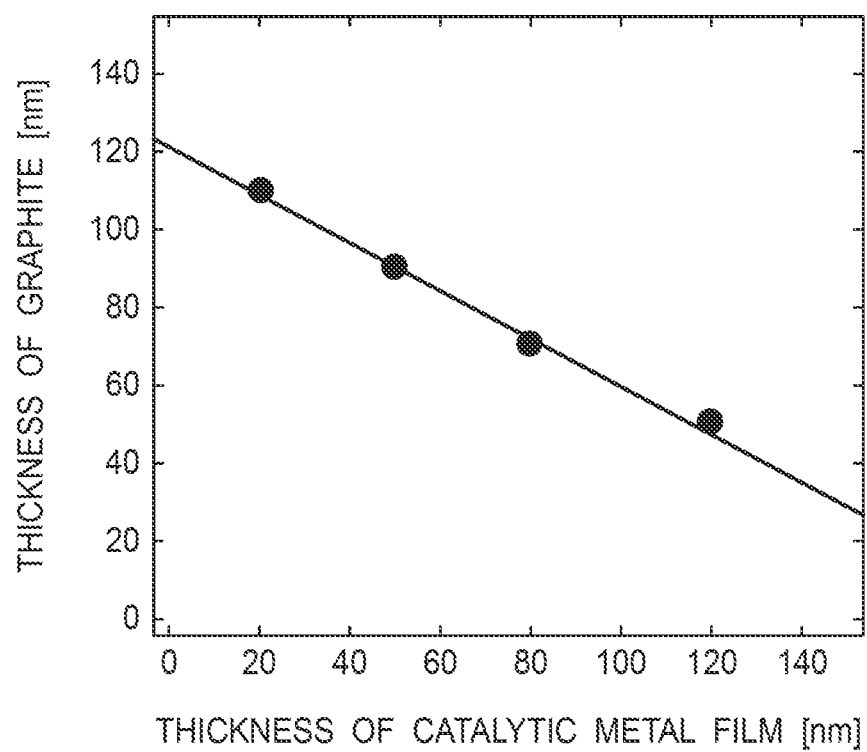
FIG. 6 is a graph illustrating a relationship between a film thickness of a catalytic metal film and a film thickness of a graphite layer to be grown.

FIGS. 1 and 2 are sectional views illustrating a structure of the graphite structure according to the present embodiment. FIG. 3 is a plan view illustrating the structure of the graphite structure according to the present embodiment. FIGS. 4 and 5 are views illustrating a relationship between a configuration of a catalytic metal film and a configuration of the graphite structure to be grown. FIG. 6 is a graph illustrating a relationship between a film thickness of a catalytic metal film and a film thickness of a graphite layer to be grown. FIGS. 7A-8C are sectional views illustrating the method of manufacturing the graphite structure according to the present embodiment.

First, the structure of the graphite structure according to the present embodiment will be described with reference to FIGS. 1 to 6.

FIG. 1 is a copy of a TEM image of a sectional structure of a sample with a catalytic metal film and a graphite layer formed above a substrate.

As illustrated in FIG. 1, a surface of the catalytic metal film formed above the substrate has large concavities and the convexities. The graphite layer is formed, mitigating the surface concavities and convexities of the catalytic metal film, and its surface is substantially flat.

FIG. 2 is an enlarged view of a part of FIG. 1.

As illustrated in FIG. 2, the graphite layer formed above the catalytic metal film is not the general graphite having substantially flat graphene sheets uniformly stacked but includes an aggregate of domains of graphite where a layer body of graphene sheets is curved in domelike (hereinafter called "the domed graphite"). The domains of the domed graphite respectively have a size of about 20 nm-500 nm. The height of the domed graphite is about 20 nm-5000 nm although depending on the growth conditions and catalytic conditions. The inside of the domed graphite is hollow although depending on configurations of the base catalytic metal film.

FIG. 3 is a copy of a SEM image of the surface structure of the graphite structure according to the present embodiment.

As illustrated in FIG. 3, the aggregate of the domains of the domed graphite is arranged in plane and has the lamella-like structure of the adjacent domains of the domed graphite connected to each other at the side surfaces.

Such graphite structure is grown by using as the catalyst the catalytic metal film having the surface roughened. The catalytic metal film having concavities and convexities of an about not less than 50 nm-depth is used, the graphite grown from this catalytic metal film is influenced by the concavities and concavities and has the peculiar structure as illustrated.

The film thickness of the graphite layer grown from the catalytic metal film is decided by configurations of the concavities and convexities of the catalytic metal film. For example, in the example illustrated in FIG. 2, at the parts where the catalytic metal film is thick (the convexities, about 110 nm), the graphite layer was synthesized thin in a 46 nm-thickness. On the other hand, at the parts where the catalytic metal film is thin (the concavities, about 29 nm), the graphite layer was synthesized thick in an about 127 nm-thickness (see FIG. 4).

The configurations of the domed graphite are decided by the width of the convexities of the catalytic metal film. For example, in the example illustrated in FIG. 5, the inner diameter of the domed graphite grown from the about 72 nm-width convexities of the catalytic metal film was about 72 nm, which is equal to the width of the convexities.

FIG. 6 is a graph illustrating the relationships between the film thickness of the growing graphite layer and the film thickness of the catalytic metal film.

As illustrated in FIG. 6, the film thickness of the growing graphite layer becomes smaller as the film thickness of the catalytic metal film is larger. Based on the dependency of the grown film thickness of the graphite layer on the film thickness of the catalytic metal film, the grown graphite layer is less influenced by the surface concavities and convexities of the catalytic metal film and has the configuration having a uniform surface.

The graphite structure according to the present embodiment has the plurality of domed graphite of an about 100 nm-size two-dimensionally laid out. The aggregate of the regular structure is known as the lamella structure, but such structure of graphite has not been known.

Graphite is known as a material whose electric conductivity and heat conductivity are high. In this respect, the graphite structure according to the present embodiment has the structure that the domed graphite adjacent to each other are connected to each other, and exhibits the same high electric conductivity as graphite.

On the other hand, the neighboring domed graphite have interfaces, and in the interfaces, phonons are scattered. Accordingly, the heat conductivity of the graphite structure according to the present embodiment is drastically attenuated in comparison with the electric conductivity. Especially when the graphite structure has the relationship: scattering length of electrons>size of the domed graphite>scattering length of phonons, the heat conductivity is much attenuated. Here, the scattering length of phonons of graphite at room temperature (or higher temperatures) is not more than about 100 nm.

Accordingly, the size of the domed graphite is set at about 20 nm-500 nm, more preferably about 100 nm-200 nm, whereby the graphite structure can have high electric conductivity and low heat conductivity. Such characteristic is applicable to the thermoelectric conversion element, etc. to be described in a second embodiment. In the application to thermoelectric conversion element, etc., in many cases, the low temperature part is at room temperature, and the high temperature part is at not less than room temperature, but the graphite near the high temperature part has a high temperature, and the scattering length of the phonons becomes shorter. It is not essential to change the domain size itself of the graphite, but the domain size of the domed graphite near the high temperature part may be reduced to not more than 100 nm. It is possible to increase the domain size of the domed graphite gradually from the high temperature part to the low temperature part to thereby comply the size to the changes of the scattering length of the phonons.

Next, the method of manufacturing the graphite structure according to the present embodiment will be described with reference to FIGS. 7A-8C.

Figure 7A:
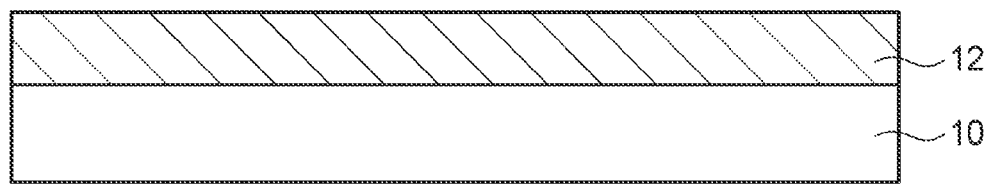
FIGS. 7A-7C and 8A-8C are sectional views illustrating a method of manufacturing the graphite structure according to the first embodiment.

First, iron (Fe) of, e.g., an about 10 nm-500 nm thickness, more preferably an about 50 nm-250 nm thickness is deposited above the substrate 10 by, e.g., sputtering method to form a catalytic metal film 12 (FIG. 7A).

The substrate 10 is not especially limited and can be, e.g., a semiconductor substrate, such as a silicon substrate with a thermal oxide film of an about 100 nm-400 nm thickness formed on, or others, a metal substrate, such as a stainless substrate or others, an insulating substrate, such as a sapphire substrate, an AlN substrate, an alumina substrate or others, or others.

The catalytic material forming the catalytic metal film 12 is not especially limited and can other than iron, a transition metal, such as cobalt (Co), nickel (Ni) or others, a noble metal, such as platinum (Pt), gold (Au) or others, a compound, such as an oxide containing such metal or a nitride containing such metal, or others.

As a catalytic promoter material enhancing the function of the catalyst, aluminum (Al), aluminum oxide ($AlO_x$), aluminum nitride (AlN), titanium (Ti), titanium nitride (TiN), titanium oxide ($TiO_x$), titanium silicide ($TiSi_x$), tantalum (Ta), tantalum oxide ($TaO_x$), tantalum nitride (TaN), molybdenum (Mo), molybdenum oxide ($MoO_x$), zirconium (Zr), zirconium oxide ($ZrO_x$), hafnium (Hf), hafnium oxide ($HfO_x$), vanadium (V), vanadium oxide ($VO_x$) or a compound of them may be used with the above-described catalytic materials. The catalytic metal film 12 may be formed of an alloy or a compound of the catalytic material and the catalytic promoter material described above. The film thickness of the catalytic promoter material in this case is about 0.5 nm-50 nm.

The film forming process for the catalytic metal film 12 is not especially limited and can be, other than sputtering method, electron beam evaporation method, molecular beam epitaxy method, atomic layer deposition (ALD) method, chemical vapor deposition (CVD) method, or others.

Then, the substrate 10 with the catalytic metal film 12 formed on is loaded into a vacuum furnace, and the temperature is raised to, e.g., about 620° C. in a high vacuum.

Figure 7B:
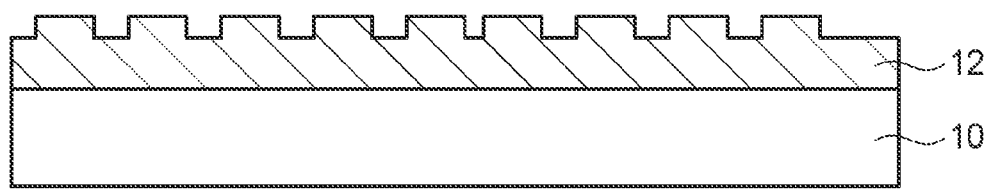

Then, in the vacuum furnace, thermal processing is made in hydrogen atmosphere to roughen the surface of the catalytic metal film 12 (FIG. 7B). As the processing conditions, for example, hydrogen gas is fed at an about 200 sccm flow rate; the pressure in the furnace is about 1 kPa; the processing temperature is about 620° C.; and the processing period of time is about 10 minutes. By this processing, the catalytic metal film 12 can be self-organized, having concavities and concavities suitable to grow domed graphite of an about 100 nm-200 nm size. The catalytic metal film 12 suitable to grown domed graphite has, for example, convexities of a width substantially equal to a diameter of the domed graphite to be grown (see FIG. 5).

As the conditions of the processing of roughening the surface of the catalytic metal film 12, the film thickness, etc. are set suitably so that concavities and convexities suitable to grow the domed graphite of a prescribed size are formed. The processing of roughening the surface of the catalytic metal film 12 is not limited to the heat processing in hydrogen atmosphere described above. For example, heating processing in the atmosphere of a gas other than hydrogen or in vacuum, processing by the temperature increase in hydrogen atmosphere, a physical processing, such as reverse sputtering, milling or others, or a processing combining the processing described above can be used.

Next, in the same vacuum furnace, graphite is grown by, e.g., CVD method with the surface-roughened catalytic metal film 12 as the catalyst. As the growing conditions, for example, hot filament CVD (HF-CVD) method is used; the hot filament temperature is, e.g., about 1000° C. (measured by a pyrometer); and the substrate temperature is, e.g., about 620° C., (calibrated by a thermocouple). As the growth gas, for example, the mixed gas of acetylene and argon (acetylene by about 10%); the flow rate is, e.g., about 200 sccm; the gas pressure is, e.g., about 1 kPa; and the growing period of time is, e.g., about 60 minutes.

The processing for growing the graphite is not especially limited and can be, other than hot filament CVD method, thermal CVD method, plasma CVD method, remote plasma CVD method or others. The raw material gas can be, other than acetylene gas, a hydrocarbon-based gas, as of methane, ethylene or others, or an alcohol gas, as of ethanol, methanol or others. As the growth temperature, the graphite can be grown at a temperature of the range of 400° C.-1000° C., more preferably of the range of 500° C.-700° C. when the catalyst is iron, cobalt, nickel, etc. Preferably, the conditions for growing the graphite are set suitably corresponding to the growth processing, catalytic metal material or others.

Figure 8A:
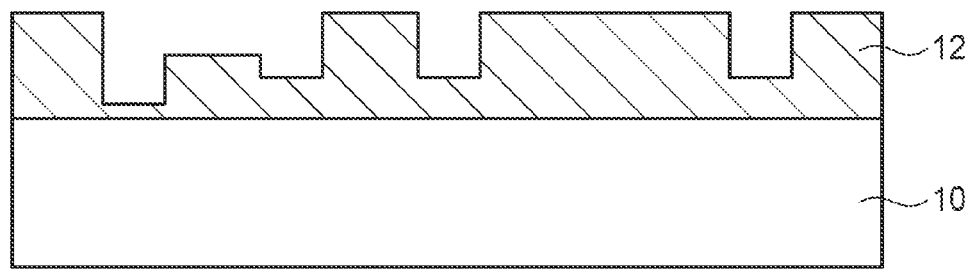
Figure 8B:
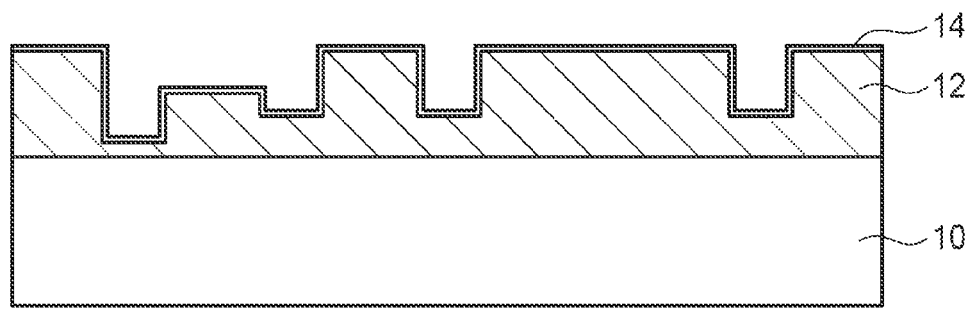
Figure 8C:
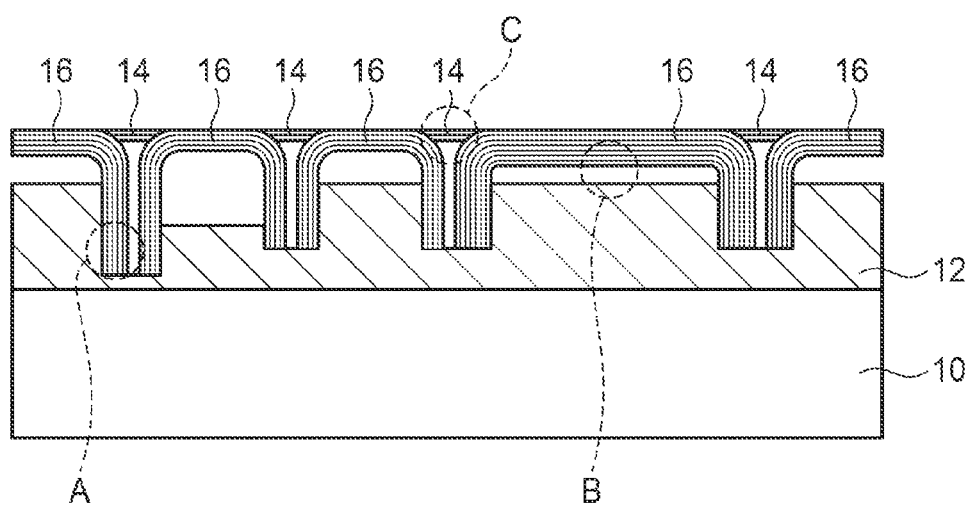

In the initial stage of the growth of the graphite, the graphite layer 14 is deposited uniformly above the surface of the catalytic metal film 12 (see FIGS. 8A-8B).

Then, the graphite layer 14 grows in conformity with the film thickness and configurations of the concavities and convexities of the base catalytic metal film 12. As exemplified in FIG. 8C, at the part where a concavity of the catalyst is deep, the graphite layer 14 extended along the side wall of the concavity is elongated, and a domed graphite 16 whose height is large is formed (see Region A, etc. in FIG. 8C). On the other hand, at a part where a convexity of the catalyst is large and flat, the graphite becomes thick, and the domed graphite 16 less vaults (see Region B, etc. in FIG. 8C). The domed graphite 16 adjacent to each other are connected by the graphite layer 14 (see Region C, etc. in FIG. 8C).

Figure 7C:
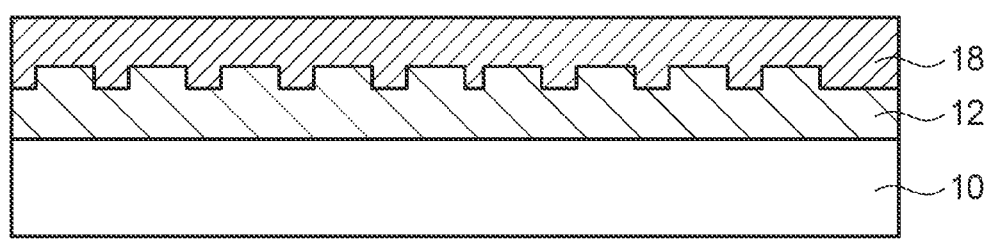

Resultantly, above the catalytic metal film 12, the graphite structure 18 having a uniform surface is formed (FIG. 7C).

As described above, according to the present embodiment, a graphite structure including an aggregate of domains of domed graphite of a layer body of graphene sheets can be formed. This graphite structure can make compatible high electric conductivity and low heat conductivity.

[A Second Embodiment]

A thermoelectric conversion element and a method of manufacturing the same according to a second embodiment will be described with reference to FIGS. 9 to 12B. The same members of the graphite structure and the method of manufacturing the same according to the first embodiment illustrated in FIGS. 1 to 8C are represented by the same reference numbers not to repeat or to simplify their description.

Figure 9:
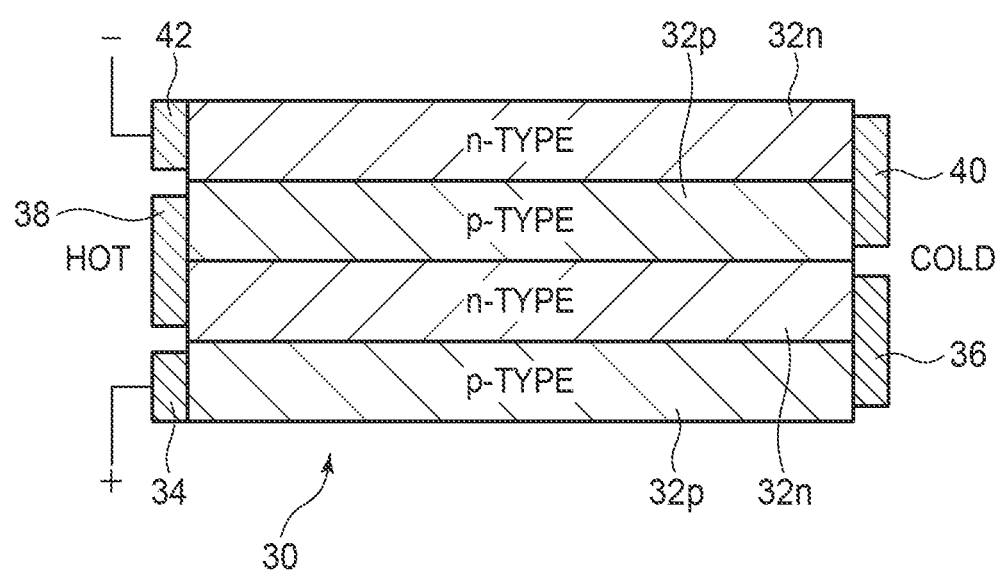
FIG. 9 is a diagrammatic sectional view illustrating a structure of a thermoelectric conversion element according to a second embodiment.
Figure 10:
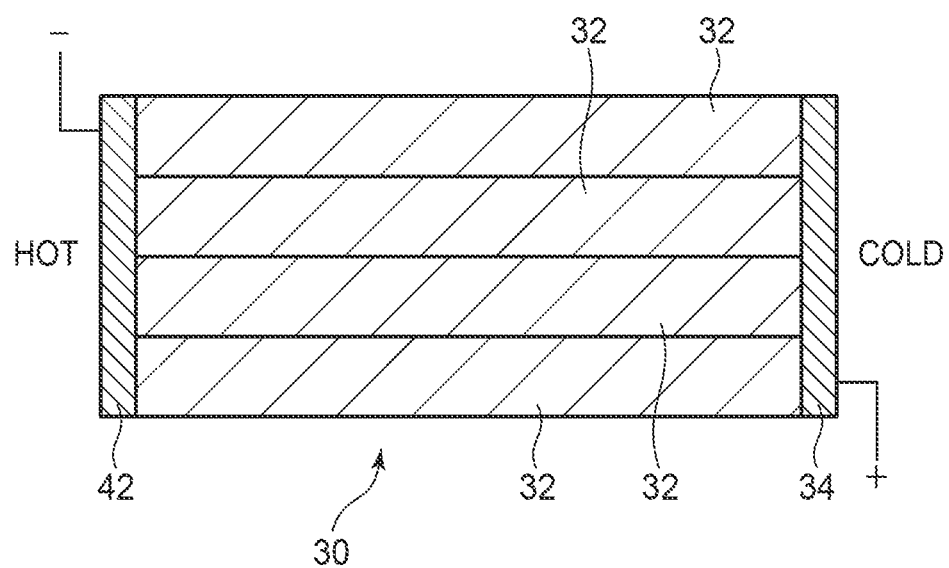
FIG. 10 is a diagrammatic sectional view illustrating a structure of a thermoelectric conversion element according to another example of the second embodiment.

FIG. 9 is a diagrammatic sectional view illustrating a structure of the thermoelectric conversion element according to the present embodiment. FIG. 10 is a diagrammatic sectional view illustrating a structure of a thermoelectric conversion element according to another example of the present embodiment. FIGS. 11A-12B are sectional views illustrating the method of manufacturing the thermoelectric conversion element according to the present embodiment.

First, a structure of the thermoelectric conversion element according to the present embodiment will be described with reference to FIGS. 9 and 10.

As illustrated in FIG. 9, the thermoelectric conversion element according to the present embodiment includes two thermoelectric conversion material films 32p formed of a p-type semiconductor thermoelectric conversion material and two thermoelectric conversion material films 32n formed of an n-type semiconductor thermoelectric conversion material. The thermoelectric conversion material films 32p and the thermoelectric conversion material films 32n are formed of the graphite structure according to the first embodiment buried by a resin material. The thermoelectric conversion films 32p and the thermoelectric conversion materials 32n are alternately stacked. On both ends of the thermoelectric conversion material films 32p and the thermoelectric conversion material films 32n, electrodes 34, 36, 38, 40, 42 are provided so that the thermoelectric conversion material films 32p and the thermoelectric conversion material films 32n are alternately connected in series.

With the side of the electrodes 34, 38, 42 of the thermoelectric conversion element 20 positioned at a higher temperature part and the side of the electrodes 36, 40 positioned at a lower temperature part, an electromotive force with the side of the electrodes 36, 40 being the positive direction is generated between the side of the electrodes 34, 38 and the side of the electrodes 36, 40 of the thermoelectric conversion material film 32p. Between the side of the electrodes 38, 42 and the side of the electrodes 36, 40 of the thermoelectric conversion material films 32n, an electromotive force with the side of the electrodes 36, 40 being the negative direction is generated (Seebeck effect). This supplies electric power outsides from the electrodes 34, 42. Oppositely, when a voltage is applied between the electrode 34 and the electrode 42, the side of one of the electrodes is heated, and the side of the other of the electrodes is cooled (Peltier effect).

As described above, the graphite structure according to the first embodiment has the characteristics of high electric conductivity and low heat conductivity and is suitable as the thermoelectric conversion material of the thermoelectric conversion element.

By using the graphite structure according to the first embodiment in a thermoelectric conversion element, the highly effective thermoelectric conversion element having a high performance index ZT can be realized.

In the example of FIG. 9, the thermoelectric conversion material films 32p and the thermoelectric conversion material films 32n are alternately stacked. This is to increase the electromotive force. It is also possible that as illustrated in FIG. 10, a plurality of thermoelectric conversion material films 32 formed of p-type or n-type semiconductor thermoelectric conversion material are stacked, and a pair of electrodes are formed each entirely on both sides.

The thermoelectric conversion material film 32 may not be essentially stacked in four layers as illustrated in FIGS. 9 and 10 and can be decreased or increased suitably in accordance with a required electromotive force, etc.

Next, the method of manufacturing the thermoelectric conversion element according to the present embodiment will be described with reference to FIGS. 11A-12B.

Figure 11A:
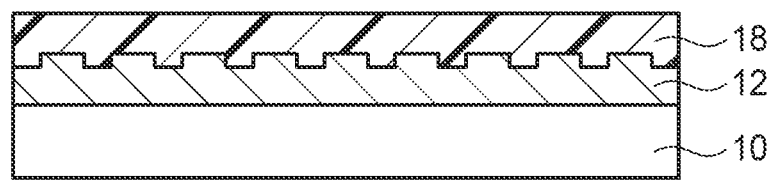
FIGS. 11A-11C and 12A-12B are sectional views illustrating a method of manufacturing the thermoelectric conversion element according to the second embodiment.

First, in the same way as in the method of manufacturing the graphite structure according to the first embodiment, the catalytic metal film 12 and a graphite structure 18 are formed above the substrate 10 (FIG. 11A).

Then, as required, an impurity of a prescribed conductivity type is doped into the graphite structure 18 by, e.g., ion implantation. In doping the impurity into the graphite structure 18 by ion implantation, the impurity may be doped in growing the graphite structure 18.

Figure 11B:
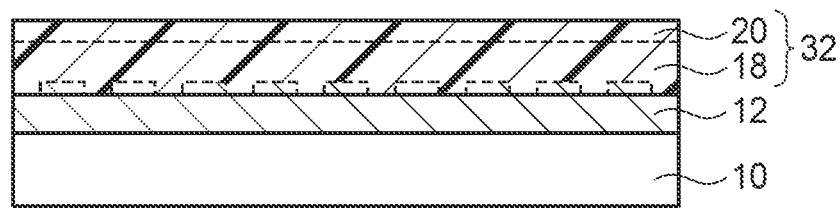

Then, above the graphite structure 18 thus formed, a resin layer 20 is formed by, e.g., spin coating method (FIG. 11B). The material forming the resin layer 20 is not especially limited and can be, e.g., a hot-melt resin, such as a polyamide-based hot melt resin, polyurethane-based hot melt resin, polyolefin-based hot melt resin or others, acrylic resin, epoxy resin, silicone resin, polyvinyl-based resin, wax or others can be used. The process for forming the resin layer 20 is not especially limited.

Then, the catalytic metal film 12 is dissolved by wet etching with, e.g., hydrochloric acid to peel the graphite structure 18 and the resin layer 20 from the substrate 10. The catalytic metal layer 12 is removed, because the general catalytic metal materials are metal materials of high heat conductivity, i.e., so as to prevent the catalytic metal film 12 from being a heat conduction path to resultantly to hinder good thermoelectric conversion performance. The catalytic metal film 12 is may not be essentially removed unless the catalytic metal film 12 influences the thermoelectric conversion performance of the graphite structure 18.

Figure 11C:

Thus, a thermoelectric conversion material film 32 with the graphite structure 18 buried in the resin layer 20 is formed (FIG. 11C).

As described above, the thermoelectric conversion material films 32 a thermoelectric conversion element to be formed requires are prepared. The thermoelectric conversion element illustrated in FIG. 9 is formed here, and two thermoelectric conversion material films 32p including the p-type graphite structure 18, and two thermoelectric conversion material films 32n including the n-type graphite structure 18 are prepared.

Figure 12A:
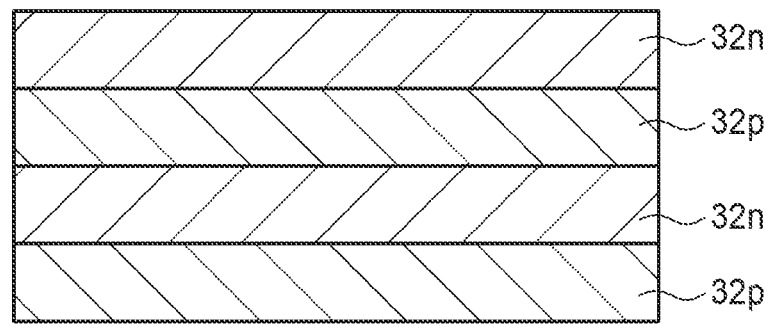

Next, the thermoelectric material films 32p and the thermoelectric conversion material films 32n are alternately stacked (FIG. 12A).

At this time, a thermoplastic resin, such as a hot melt resin or others, is used as the resin layer 20, which facilitates the integration of the multilayer structure by heating after stacked.

Figure 12B:
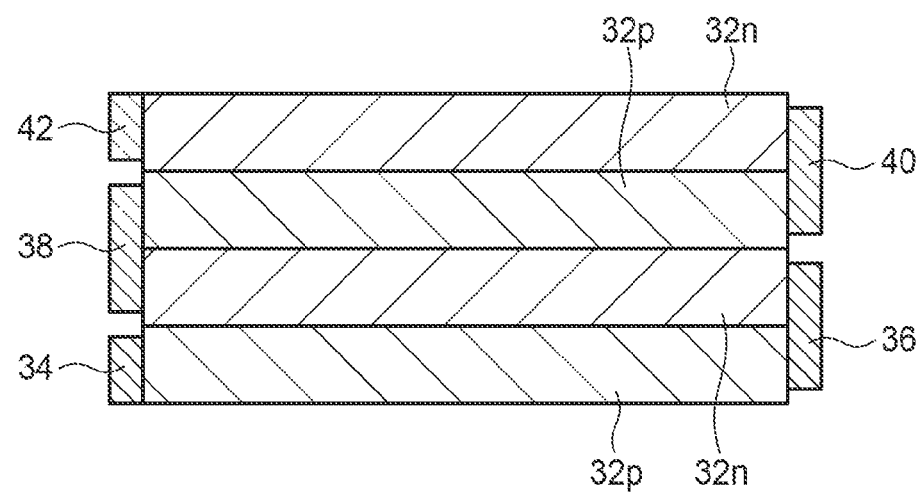

Then, on the side surfaces of the thus formed multilayer structure, the electrodes 34, 36, 38, 40, 42 are formed, and the thermoelectric conversion element according to the present embodiment is completed (FIG. 12B).

The electrodes 34, 36, 38, 40, 42 may be formed of the layer film (Au/Ti) of, e.g., an about 5 nm-thickness titanium (Ti) and an about 100 nm-thickness gold (Au). The constituent material of the electrodes 34, 36, 38, 40, 42 is not especially limited and can be, other than the layer film of Au/Ti, e.g., the layer film of titanium, platinum (Pt) and gold (Au/Pt/Ti), the layer film of titanium and palladium (Pd) (Pd/Ti), the layer film of titanium and titanium nitride (TiN/Ti), the layer film of titanium and aluminum (Al) (Al/Ti), the layer film of titanium and tantalum (Ta) (Ta/Ti), the layer film of titanium and copper (Cu) (Cu/Ti), or others. The titanium is used for ensuring the adhesion to the graphite structure 18, and the other metals are used for the function of the electrodes. The film thickness of the titanium is not especially limited but is preferably about 1 nm-50 nm. The film thickness of the electrode metal is not especially limited but is preferably about 50 nm-1000 nm. Other than such layer film, indium (In) can be used.

The process of forming the electrodes 34, 36, 38, 40, 42 is not especially limited but can be, e.g., sputtering method, electron beam evaporation method or others.

As described above, according to the present embodiment, the thermoelectric conversion element is formed of the graphite structure according to the first embodiment whose electric conductivity is high and whose heat conductivity is low, whereby the thermoelectric conversion material having a high performance index ZT can be realized.

[A Third Embodiment]

The sheet structure and a method of manufacturing the same according to a third embodiment will be described with reference to FIG. 13 to FIG. 14D. The same members of the present embodiment as those of the graphite structure and the method of manufacturing the same according to the first embodiment illustrated in FIGS. 1 to 8C are represented by the same reference numbers not to repeat or to simplify their description.

Figure 13:
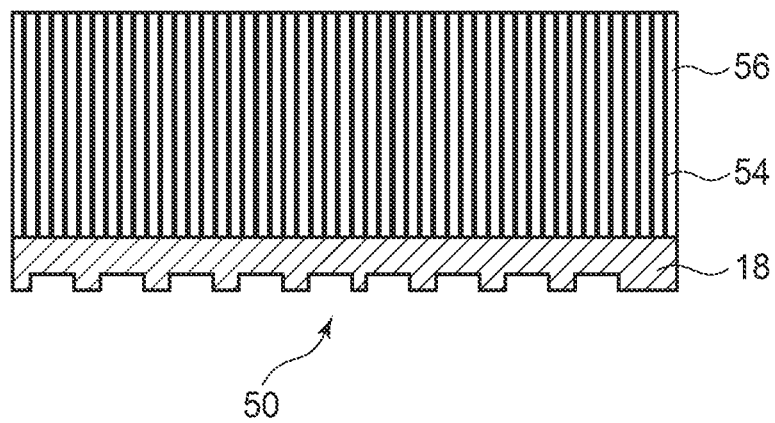
FIG. 13 is a diagrammatic sectional view illustrating a structure of a sheet structure according to a third embodiment.

FIG. 13 is a diagrammatic sectional view illustrating a structure of the sheet structure according to the present embodiment. FIGS. 14A-14D are sectional views illustrating the method of manufacturing the sheet structure according to the present embodiment.

First, the structure of the sheet structure according to the present embodiment will be described with reference to FIG. 13.

As illustrated in FIG. 13, the sheet structure according to the present embodiment includes the graphite structure 18 according to the first embodiment, carbon nanotubes 54 grown on the graphite structure 18, and a filling layer 56 filled in the gaps among the carbon nanotubes 54.

An application of the sheet structure according to the present embodiment is, for example, the thermal interface material (TIM) provided between IC chips and a heat spreader. The heat radiation property of graphite and carbon nanotube as a material property is very high in comparison with that of indium used as a material of the TIM, and the sheet structure according to the present embodiment is suitable as a heat conductive sheet. Graphite and carbon nanotube are materials having high electric conductivity in addition to high heat conductivity, which allows the sheet structure according to the present embodiment can be used not only as a heat conductive sheet but also as an electric conductive sheet.

As a heat radiation sheet using a carbon-based material is a heat radiation sheet using carbon nanotubes. In such heat radiation sheet, to utilize the high heat conductivity of the carbon nanotubes in the orientation direction, the carbon nanotubes are oriented in the direction vertical of the surface of the sheet. However, in the heat radiation sheet only using the carbon nanotubes, the heat radiation sheet radiate heat in the direction along the orientation direction of the carbon nanotubes (normal direction of the sheet) but do not substantially radiate heat among the carbon nanotubes (in the direction along the surface of the sheet), which is considered not sufficient in terms of heat diffusion.

In this point, the sheet structure 50 according to the present embodiment, in which the graphite structure 18 is formed extended in the direction parallel to the surface of the sheet, contributes to the heat conduction and electric conduction in the direction parallel to the surface of the sheet. The carbon nanotubes 54, which are oriented in the direction vertical to the surface of the sheet, contributes to the heat conduction and the electric conduction in the direction vertical to the surface of the sheet.

Thus, the sheet structure 50 according to the present embodiment combining the two kinds of materials having different heat radiation paths can make heat diffusion in addition to the heat radiation, and can realize more effective heat radiation.

Additionally, the graphite structure 18 according to the first embodiment used in the sheet structure 50 according to the present embodiment is an aggregate of domed graphite forming concavities and convexities, which serves to disperse a pressure not to concentrate on a part in loading a pressure to secure the TIM.

The sheet structure according to the present embodiment can be used other than as the heat radiation sheet of CPU, e.g., in high output amplifiers of wireless communication stations, high output amplifiers of wireless communication terminals, high output switches for electric cars, servers, personal computers, etc. As the electric conductive sheet, the sheet structure according to the present embodiment is usable in vertical interconnection sheets and various applications using the vertical interconnection sheets by utilizing the high allowable current density characteristic of the carbon nanotubes.

Next, the method of manufacturing the sheet structure according to the present embodiment will be described with reference to FIGS. 14A-14D.

First, in the same way as in the method of manufacturing the graphite structure according to the first embodiment, the catalytic metal film 12 and the graphite structure 18 are formed above the substrate.

The heat conductivity in the direction parallel to the surface of the sheet can be changed by the size of the domed graphite (refer to the first embodiment). Preferably, the size of the domed graphite is set suitably corresponding to the heat conductivity, etc. required of the sheet structure.

Figure 14A:
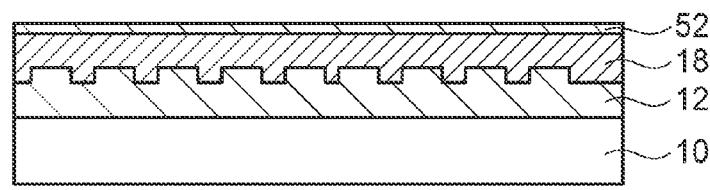
FIGS. 14A-14D are sectional views illustrating a method of manufacturing the sheet structure according to the third embodiment.

Next, above the graphite structure 18, iron of an about 0.5 nm-7 nm thickness, e.g., a 5 nm-thickness is deposited by, e.g., sputtering method to form a catalytic metal film 52 (FIG. 14A).

The catalytic material forming the catalytic metal film 52 is not especially limited and can be, other than iron, a transition metal, such as cobalt, nickel or others, a noble metal, such as platinum, gold or others, a compound, such as an oxide, a nitride or others containing such metal, or others.

As a catalytic promoter material enhancing the function of the catalyst, aluminum, aluminum oxide, aluminum nitride, titanium, titanium nitride, titanium oxide, titanium silicide, tantalum, tantalum oxide, tantalum nitride, molybdenum, molybdenum oxide, zirconium, zirconium oxide, hafnium, hafnium oxide, vanadium, vanadium oxide or a compound of them may be used with the above-described catalytic materials. The catalytic metal film 52 may be formed of an alloy or a compound of the catalytic material and the catalytic promoter material described above.

The film forming process for the catalytic metal film 52 is not especially limited and can be, other than sputtering method, electron beam evaporation method, molecular beam epitaxy method, atomic layer deposition method, chemical vapor deposition method or others.

Figure 14B:
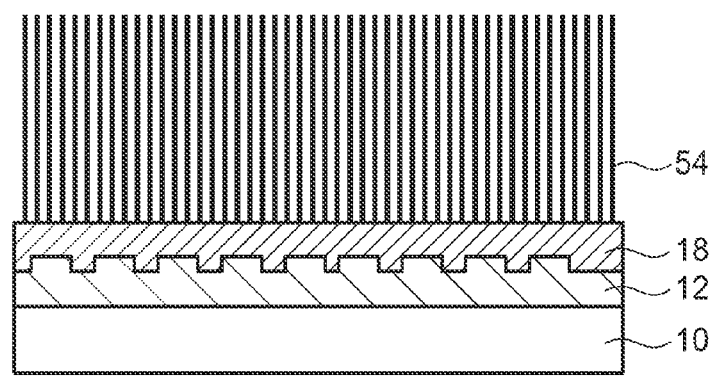

Then, with the catalytic metal film 52 as the catalyst, the carbon nanotubes 54 are grown by, e.g., CVD method (FIG. 14B). The catalytic metal film 52 coheres and is contained in the carbon nanotubes 54 while the carbon nanotubes 54 are growing and are not illustrated in the following drawing.

As the conditions for growing the carbon nanotubes 54, for example, hot filament CVD (HF-CVD) method is used; the hot filament temperature is, e.g., about 1000° C. (measured by a pyrometer); and the substrate temperature is, e.g., about 620° C. (calibrated by a thermocouple). The growth gas is, e.g., a mixed gas of acetylene and argon (acetylene by about 10%); the flow rate is, e.g., 200 sccm; and the gas pressure is, e.g., about 1 kPa. The growth period of time is set at, e.g., about 60 minutes.

The process for growing the carbon nanotubes 54 is not especially limited and can be, other than hot filament CVD method, thermal CVD method, plasma CVD method, remote plasma CVD method or others. The raw material gas can be, other than acetylene gas, a hydrocarbon-based gas, as of methane, ethylene or others, or an alcohol, as of ethanol, methanol or others. As the growth temperature, the carbon nanotubes can be grown at a temperature of the range of 400° C.-1000° C., more preferably of the range of 500° C.-700 ° C. when a transition metal, such as iron, cobalt, nickel or others, is used as the catalyst. Preferably, the conditions for growing the carbon nanotubes are set suitably corresponding to the growth processing, catalytic metal material or others.

By the above-described process, above the graphite structure 18, the carbon nanotubes 54 of an about 5 nm-10 nm diameter and an about 100 μm length can be formed in an area density of about $1 \times 10^{11}$ tubes/cm$^2$.

Figure 14C:
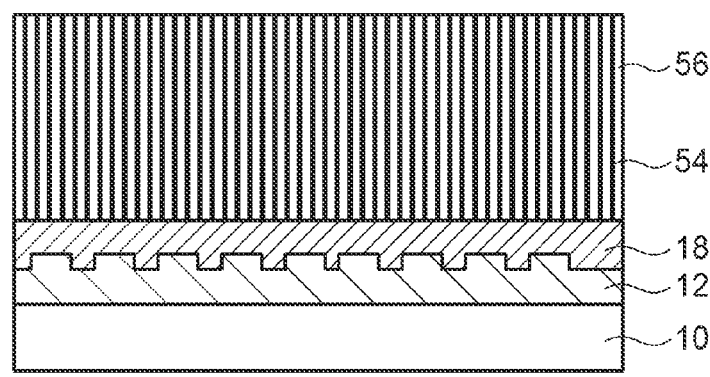

Then a resin material is buried among the carbon nanotubes 54 to form the filling layer 56 (FIG. 14C). The resin material forming the filling layer 56 is not especially limited and can be, e.g., a hot melt resin, such as polyamide-based hot melt resin, polyurethane-based hot melt resin, polyolefin based hot melt resin or others, acrylic resin, epoxy resin, silicone resin, polyvinyl resin, wax or others. When the sheet structure is used as the TIM of CPU, adhesion, flexibility and heat resistance are required, and a hot melt resin is suitable.

The process for forming the filling layer 56 is not especially limited and can be, e.g., the process of making heat processing on a resin material mounted on the carbon nanotubes 54 and permeating the resin, spin coating method or others.

Before the resin material is filled, a metal thin film may be deposited above the carbon nanotubes 54 by electron beam evaporation method, sputtering method or others. In this case, the metal thin film to be deposited is not especially limited and can be, e.g., nickel, copper, molybdenum, platinum, gold, silver, indium or others. The film thickness of the metal thin film to be deposited is not especially limited and may be suitably in the range of 50 nm-2000 nm. The metal deposit can connect the carbon nanotubes integral, and can be easily peeled in the sheet.

Figure 14D:
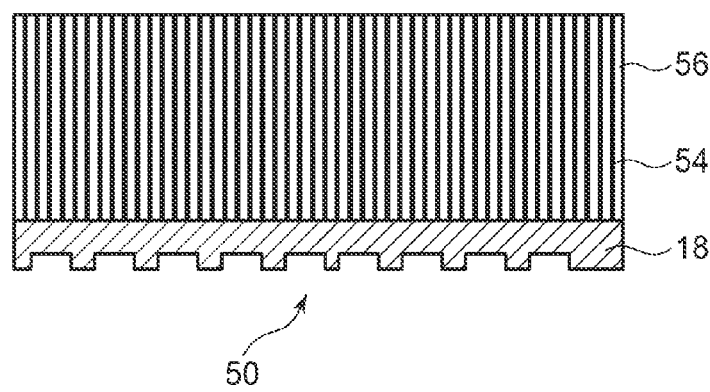

Next, the graphite structure 18, the carbon nanotubes 54 and the filling layer 56 are peeled from the substrate 10, and the sheet structure according to the present embodiment is completed (FIG. 14D).

At this time, often the catalytic metal film 12 remains on the backside of the graphite structure 18, but this especially causes no problem when the sheet structure is used as a TIM. If required, the residual catalytic metal film 12 can be easily removed by chemical liquid treatment with hydrochloric acid or others.

Although not described in the present embodiment, a coating film may be formed on the upper ends of the carbon nanotubes 54 after the carbon nanotubes 54 have been grown and before the filling layer 56 is formed. The coating film can decrease the contact resistance and contact heat resistance between the carbon nanotubes 54 and the adhered body of the sheet structure.

The constituent material of the coating film is not especially limited as long as the constituent material is a material of higher heat conductivity than the constituent material of the filling layer 56. When the sheet structure is used for the electric conduction, an electric conductive material, e.g., a metal, an alloy or others, can be used. The constituent material of the coating film can be, e.g., copper, nickel, gold, indium, low-melting point solder or others. The coating film may be a single layer structure of such metal, or a two-layer, a three-laver or more-layer structure, such as a layer structure of titanium and gold or others.

When the sheet structure according to the present embodiment is used as a TIM, a heat spreader may be used as the substrate 10, and the sheet structure according to the present embodiment may be formed directly above the heat spreader. In this processing, the graphite structure 18 is grown directly on the heat spreader, which provides the merit of decreasing the heat resistance in the interface.

As described above, according to the present embodiment, the sheet structure includes the graphite structure according to the first embodiment and carbon nanotubes, whereby the sheet can be a heat conductive sheet of high heat conduction and heat diffusion.

[Modified Embodiments]

The above-described embodiments can cover other various modifications.

For example, the constituent materials and the manufacturing conditions described in the embodiments described above are not limited to those described above and can be suitably changed in accordance with purposes, etc.

In the above-described embodiments, as examples of electronic components using the graphite structure according to the first embodiment, the thermoelectric conversion element is described in the second embodiment, and the heat radiation sheet is described in the third embodiment, but the electronic components the graphite structure according to the first embodiment is applicable are not limited to them. The graphite structure according to the first embodiment is applicable to various uses by utilizing the thermal and/or electric characteristics, and the stress relaxation, etc., by the domed graphite.

In the third embodiment, the sheet structure with carbon nanotubes formed on the graphite structure is described, but in place of the carbon nanotubes, another linear structure of carbon atoms may be formed. As the linear structures of carbon atoms, other than the carbon nanotubes, carbon nanowires, carbon rods, carbon fibers or others can be used. These linear structures are the same as the carbon nanotubes except that they are different from carbon nanotubes in the size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A graphite structure comprising:
a plurality of domed graphite domains,
a catalytic metal film having concavities and convexities, and
a substrate, in this order,
wherein the each domed graphite domain includes a plurality of curved graphene sheets layered on each other, the each domed graphite domain including a first part parallel to the substrate at a top of the domed graphite domain and a second part perpendicular to the substrate at a side of the domed graphite domain, the second part continuously connected to the first part and the catalytic metal film, the each domed graphite domain having a hollow portion between an inner surface of the domed graphite domains and the substrate, wherein
the plurality of domed graphite domains are arranged in plane, and
the domed graphite domains adjacent to each other are in direct contact with each other.

2. The graphite structure according to claim 1, wherein the size of the domains is 20 nm-500 nm.

3. The graphite structure according to claim 1, wherein the height of the domains is 20 nm-5000 nm.

4. An electronic component comprising:
a graphite structure including a plurality of domed graphite domains, a catalytic metal film having concavities and convexities and a substrate, in this order,
wherein the each domed graphite domain includes a plurality of curved graphene sheets layered on each other, the each domed graphite domain including a first part parallel to the substrate at a top of the domed graphite domain and a second part perpendicular to the substrate at a side of the domed graphite domain, the second part continuously connected to the first part and the catalytic metal film, the each domed graphite domain having a hollow portion between an inner surface of the domed graphite domains and the substrate, wherein the plurality of domed graphite domains are arranged in plane, and the domed graphite domains adjacent to each other are in direct contact with each other.

5. The electronic component according to claim 4, comprising:
   a thermoelectric conversion material film including the graphite structure;
   a first electrode formed on one end of the thermoelectric material film and connected to the graphite structure; and
   a second electrode formed on the other end of the thermoelectric conversion material film and connected to the graphite structure.

6. The electronic component according to claim 5, wherein
   the thermoelectric conversion film includes a plurality of the graphite structures, and the plurality of graphite structures are stacked with a resin layer formed therebetween.

7. The electronic component according to claim 4, further comprising:
   a plurality of linear structures of carbon atoms formed above the graphite structure.

8. The electronic component according to claim 7, further comprising:
   a filling layer filling in gaps among the plurality of linear structures.

9. The electronic component according to claim 7, wherein
   the plurality of linear structures are carbon nanotubes.

10. The graphite structure according to claim 1, wherein
    each of the plurality of domed graphite domains includes a side surface,
    the domed graphite domains adjacent to each other are connected at the side surface.

11. The electronic component according to claim 4, wherein
    each of the plurality of domed graphite domains includes a side surface,
    the domed graphite domains adjacent to each other are connected at the side surface.

12. The graphite structure according to claim 1, wherein the hollow portion is buried by resin.

13. The electronic component according to claim 4, wherein
    the hollow portion is buried by resin.

14. The graphite structure according to claim 1, wherein the plurality of domed graphite domains is in conformity with the film thickness and configurations of the concavities and convexities of the catalytic metal film.

* * * * *